(12) United States Patent
Schreiber et al.

(10) Patent No.: US 12,165,700 B2
(45) Date of Patent: Dec. 10, 2024

(54) SRAM POWER SAVINGS AND WRITE ASSIST

(71) Applicant: Advanced Micro Devices, Inc., Santa Clara, CA (US)

(72) Inventors: Russell J. Schreiber, Austin, TX (US); John J. Wuu, Ft. Collins, CO (US); Keith A. Kasprak, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 170 days.

(21) Appl. No.: 17/488,519

(22) Filed: Sep. 29, 2021

(65) Prior Publication Data

US 2023/0100607 A1    Mar. 30, 2023

(51) Int. Cl.
*G11C 11/419* (2006.01)
*G11C 11/418* (2006.01)

(52) U.S. Cl.
CPC .......... *G11C 11/419* (2013.01); *G11C 11/418* (2013.01)

(58) Field of Classification Search
CPC ............................ G11C 11/418; G11C 11/419
USPC ........................................................ 365/156
See application file for complete search history.

(56) References Cited

U.S. PATENT DOCUMENTS

| | | | | |
|---|---|---|---|---|
| 6,788,566 B1* | 9/2004 | Bhavnagarwala | .... | G11C 11/413 365/204 |
| 8,345,504 B2* | 1/2013 | Chuang | ................. | G11C 11/413 365/226 |
| 8,503,221 B1* | 8/2013 | Hobson | ................. | G11C 11/412 365/154 |
| 9,542,998 B1* | 1/2017 | Akhilesh | ............... | G11C 11/419 |
| 10,043,572 B1 | 8/2018 | Schreiber et al. | | |
| 10,332,570 B1 | 6/2019 | Ahmed | | |
| 10,438,636 B2 | 10/2019 | Ahmed et al. | | |
| 2009/0207650 A1* | 8/2009 | Braceras | ............... | G11C 11/417 365/156 |
| 2011/0063895 A1* | 3/2011 | Komatsu | ............... | G11C 11/413 365/156 |

OTHER PUBLICATIONS

Zimmer, B., et al., "SRAM Assist Techniques for Operation in a Wide Voltage Range in 28-nm CMOS," IEEE Transactions on Circuits and Systems—II: Express Briefs, vol. 59, No. 12, Dec. 2012, pp. 853-857.

* cited by examiner

*Primary Examiner* — Sung Il Cho
(74) *Attorney, Agent, or Firm* — Zagorin Cave LLP

(57) ABSTRACT

A technique reduces power consumption of a bit cell in a memory and provides write assistance to the bit cell. When the bit cell is active, a power-saving write-assist circuit coupled to the bit cell is selectively sized according to a type of memory access. When the bit cell is inactive, the virtual power supply node floats to a predetermined voltage between a first voltage on a first power supply node coupled to the bit cell and a second voltage on a second power supply node coupled to the bit cell. A method for controlling power consumption of a bit cell and assisting a write to the bit cell includes providing a reference voltage to a virtual power supply node coupled to the bit cell. The reference voltage is provided based on an operational state of the bit cell and a type of memory access to the bit cell.

20 Claims, 4 Drawing Sheets

SRAM POWER SAVINGS AND WRITE ASSIST

BACKGROUND

Description of the Related Art

In general, a memory includes bit cells organized into rows and columns of an array, with a bit cell at each intersection of a row and a column. Each bit cell is an instantiation of an exemplary memory cell (e.g., a six-transistor random access memory cell). Referring to FIG. 1, bit cell 140 is an exemplary six transistor, static random access memory (SRAM) cell that is coupled to associated circuitry. Bit cell 140 includes pass transistor 101 and pass transistor 103, each having a gate terminal driven by a word line (e.g., word line WL[M:0]), where M is an integer number of word lines greater than or equal to zero. Bit cell 140 further includes two cross-coupled inverters (e.g., pull-up transistor 105 and pull-down transistor 109 cross-coupled to pull-up transistor 107 and pull-down transistor 111) coupled to bit lines (e.g., complementary bit lines including bit line true BLT[N:0] and bit line complement BLC[N:0]) via the pass transistors, where N is an integer number of bit lines greater than or equal to zero. Bit lines BLT[N:0] and BLC[N:0] are precharged and have significant capacitance since a substantial number of bit cells are coupled to the bit lines for density purposes. Word line driver 113 asserts (i.e., sets to an active level) the signal on word line WL[m] for read operations causing one of the bit lines to discharge through a pass transistor and pull-down transistor of the bit cell.

Precharge transistors 134 and 138 of precharge circuit 160 precharge bit lines BLT[N:0] and BLC[N:0] to a supply voltage level (e.g., VDD) responsive to assertion of a precharge signal (e.g., active-low bit line precharge signal BLPCX) by controller and address decoder 130 in preparation for a bit cell operation (i.e., a read or a write). Precharge signal BLPCX is active low as indicated by the "X." Equalizer transistor 136 is coupled to BLPCX and shorts together bit lines BLT[N:0] and BLC[N:0] while precharge signal BLPCX is active.

Sense amplifier circuit 120 includes read column select transistors 102 and read column select transistors 104 that function to select a desired bit line pair to couple to the sense amplifier circuit 120. Read column select transistors 102 couple (or isolate) bit line true BLT[N:0] and a sense amplifier true line (e.g., sense amplifier true line SAT). Read column select transistors 102 multiplex one of several sets of bit lines onto sense amplifier true line SAT. Read column select transistors 104 couple (or isolate) bit line complement BLC[N:0] and a sense amplifier complement line (e.g., sense amplifier complement line SAC). Read column select transistors 104 multiplex one of several sets of bit lines onto sense amplifier true line SAC according to a read column select control signal (e.g., read column select control signal RDCSX[N:0]). Read column select control signal RDCSX[N:0] is active low as indicated by the "X."

Precharge transistor 114 and precharge transistor 116 precharge sense amplifier true line SAT and sense amplifier complement line SAC to VDD responsive to assertion of a sense amplifier precharge signal (e.g., active low sense amplifier precharge signal SAPCX) in preparation for a read operation. Equalizer transistor 118 is also coupled to sense amplifier precharge signal SAPCX and shorts together sense amplifier true line SAT and sense amplifier complement line SAC while precharge is active. Once sense amplifier true line SAT and sense amplifier complement line SAC are precharged, and bit lines BLT[N:0] and BLC[N:0] are precharged by the separate precharge circuit described above, precharge transistors 114 and 116 and equalizer transistor 118 are disabled, the read column selects are enabled to couple bit lines BLT[N:0] and BLC[N:0] to sense amplifier true line SAT and sense amplifier complement line SAC, respectively. A differential charge builds up on sense amplifier true line SAT and sense amplifier complement line SAC corresponding to the value of the bit cell being read. Once that differential charge has built up, differential sense amplifier circuit 120 is enabled to latch the value of the bit cell being read using an enable signal (e.g., sense amplifier enable signal SAEN), which enables tail transistor 126.

Write driver 170 includes pass transistor 150 and pass transistor 152 having gates driven by write column select signals (e.g., write column select signals WRCS[M:0]). In at least one embodiment, write column select signals WRCS[M:0] selects the active column in the exemplary column-muxed design. In an embodiment, write driver 170 includes pull-down transistor 154 and pull-down transistor 156 coupled to bit line true BLT[N:0]and bit line complement BLC[N:0], respectively, via pass transistor 150 and pass transistor 152, respectively. For write operations, controller and address decoder 130 asserts write column select signals WRCS[M:0] to cause the bit cell to be discharged from the bit lines according to a write data signal (e.g., write data true signal WDT_X and write data complement signal WDC_X, which are active low, as indicated by the "X"). In at least one embodiment, cross-coupled keeper transistors 180 hold the bit line that is not discharged at VDD despite leakage and any false read at the beginning of a write in response to controller and address decoder 130 asserting a cross-couple enable signal (e.g., cross-couple enable signal XCENX).

Conventional techniques for improving the operational voltage (i.e., minimum voltage Vmin or maximum voltage Vmax) of the SRAM use circuit level techniques on a cycle-by-cycle basis. Corresponding write assist circuits (e.g., negative bit line write assist circuits, cell VDD collapse write assist circuits, and word line boost write assist circuits) are used to write data to a bit cell. A negative bit line write assist circuit increases the gate-to-source voltage on a pass gate, which strengthens the pass-gate and helps pull a high node low while also strengthening the low-node pull up to complete a write operation. A cell VDD collapse write assist circuit increases the voltage range of the write by decreasing the strength of the cross-coupled inverters of the bit cell. A word line boost write assist circuit strengthens the pass gate to complete the write operation. In general, write assist circuits increase power consumption and area of a memory. Accordingly, improved techniques for operating a memory are desired.

SUMMARY OF EMBODIMENTS OF THE INVENTION

In at least one embodiment, a method for controlling power consumption of a bit cell and assisting a write to the bit cell includes providing a reference voltage to a virtual power supply node coupled to the bit cell. The reference voltage is provided based on an operational state of the bit cell and a type of memory access to the bit cell.

In at least one embodiment, a memory includes a bit cell coupled between a first power supply node and a virtual power supply node. The memory includes a circuit coupled between the virtual power supply node and a second power supply node. The circuit provides a reference voltage to the virtual power supply node. The reference voltage is provided based on an operational state of the bit cell and a type of memory access to the bit cell.

In at least one embodiment, a method for controlling a bit cell of a memory includes providing a reference voltage to a virtual power supply node coupled to the bit cell. In a first operational state of the bit cell, the reference voltage has a predetermined level between a first voltage on a first power supply node coupled to the bit cell and a second voltage on a second power supply node. In a second operational state of the bit cell, the reference voltage is the second voltage provided with a first strength in response to a read and the reference voltage is the second voltage provided with a second strength in response to a write. The first strength is greater than the second strength.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A technique reduces power consumption of a bit cell in a memory and provides write assistance to the bit cell. When the bit cell is active, a power-saving write-assist circuit coupled to the bit cell is selectively sized according to a type of memory access. When the memory access is a read, the power-saving write-assist circuit is sized to be large enough to sink charge from complementary bit lines without developing a voltage drop across the power-saving write-assist circuit that would impact read performance. When the memory access is a write, the power-saving write-assist circuit is sized to develop a voltage drop across the power-saving write-assist circuit that reduces the strength of the bit cell pull-up devices making the bit cell easier to write. When the bit cell is inactive, the virtual power supply node floats to a predetermined voltage between a first voltage on a first power supply node coupled to the bit cell and a second voltage on a second power supply node coupled to the bit cell, thereby reducing power consumption. In at least one embodiment, the technique reduces the read current of half-selected bit cells of an array of bit cells (e.g., bit cells coupled to an active word line but in an unaccessed column) by reducing the gate-to-source voltage on a pass gate of the bit cell, thereby reducing the differential developed on half-selected columns of the array of bit cells and reducing bit line precharge power consumption, which is a substantial portion of power consumed by an active bit cell.

Figure 2:
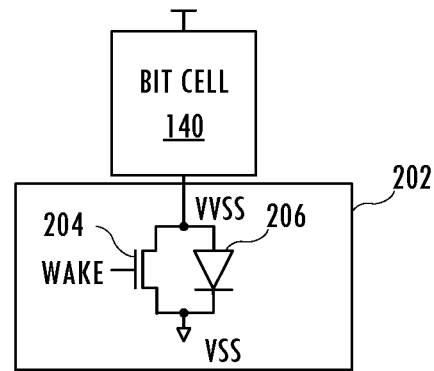
FIG. 2 illustrates an exemplary bit cell coupled to a power-saving circuit.

An exemplary power consumption reduction technique uses at least a first region of a memory and a second region of the memory and a controller unit determines independent operating states for the first region and the second region. For example, each of the first region and the second region of the memory is able to operate in at least a wake state and a sleep state. Referring to FIG. 2, when the controller unit (not shown) determines that a region including bit cell 140 has an awake state, the controller unit provides a corresponding control signal to that region to configure bit cell 140 in an awake state using circuit 202. For example, a control signal (e.g., control signal WAKE) enables footer transistor 204 to couple a virtual power supply node (e.g., virtual power supply node VVSS) to an actual power supply node (e.g., ground power supply node VSS). Accordingly, the voltage on the virtual power supply node VVSS is approximately 0V.

Figure 1:
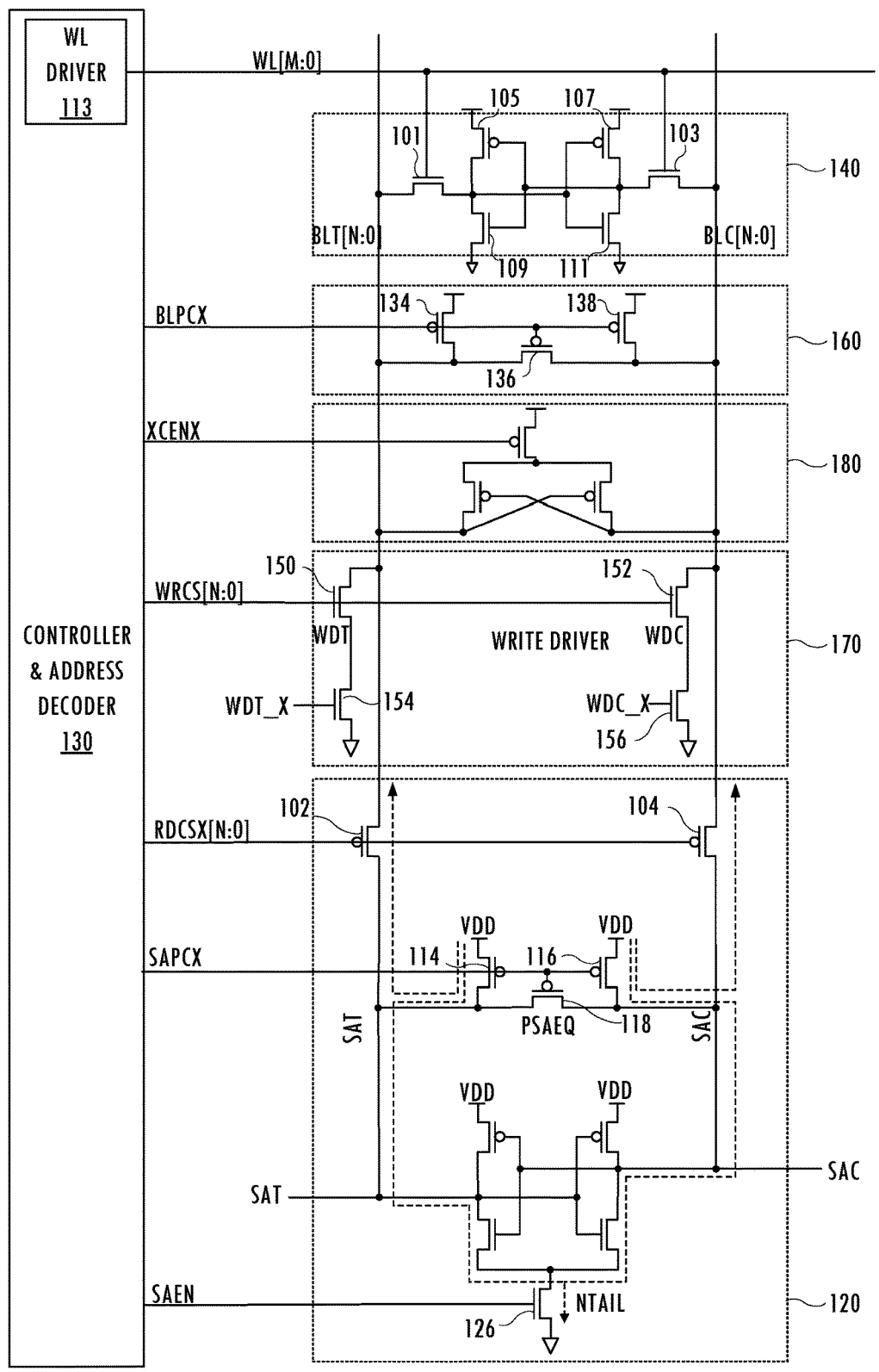
FIG. 1 illustrates a circuit diagram for an exemplary bit cell and associated circuitry.

When the controller unit determines that the region is in a sleep state, the controller unit provides a corresponding control signal to each bit cell in the region to select a positive nonzero level (e.g., approximately 500 mV) that is less than the power supply voltage, but low enough to keep the bit cell within a retention voltage limit, to be used as the ground reference for that region (e.g., one semiconductor diode drop above ground). For example, control signal WAKE is inactive (e.g., WAKE='0') and turns off footer transistor 204. Accordingly, the voltage on virtual power supply node VVSS will float up until diode 206 turns on and provides a path to power supply node VSS. In at least one embodiment, the voltage on the virtual power supply node VVSS has a level that is a one semiconductor diode voltage drop above ground. Use of that predetermined level reduces power consumption due to leakage current of the bit cell since power supplied to the bit cell is reduced by reducing the power supply voltage by a voltage drop across a semiconductor diode (i.e., VT). Thus, coupling bit cell 140 or sets of instantiations of bit cell 140 (e.g., hundreds or thousands of instantiations of bit cell 140 that share circuit 202 ) to circuit 202 reduces power consumption of half-selected bit columns of an array of bit cells during a memory access as compared to bit cell 140 being directly coupled to power supply node VSS, as illustrated in FIG. 1.

Figure 3:
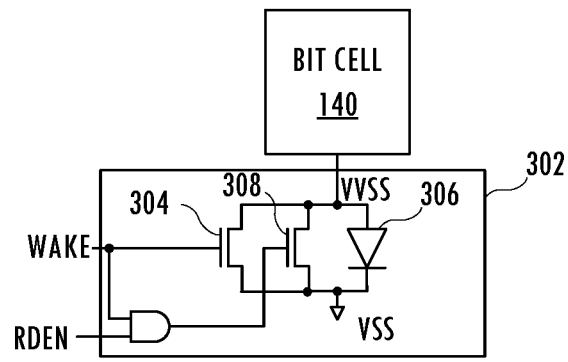
FIG. 3 illustrates an exemplary bit cell coupled to a power-saving write-assist circuit consistent with at least one embodiment of the invention.

A power consumption reduction and write assist technique includes selectively configuring a power-saving write-assist circuit coupled to a power supply node of the bit cell according to a status of the bit cell (e.g., active or asleep) and according to a type of memory access (i.e., read or write). The technique reduces power consumption in the sleep state of the bit cell and provides write assistance in an active state of the bit cell. Referring to FIG. 3, power-saving write-assist circuit 302 is coupled to virtual ground node VVSS and is configured to reduce power consumption of bit cell 140 as compared to the bit cell coupled directly to power supply node VSS and to provide write assistance to bit cell 140. In at least one embodiment, power-saving write-assist circuit 302 includes footer transistor 304, footer transistor 308, and diode 306. Logic within power-saving write-assist circuit 302 selectively enables footer transistor 304, footer transistor 308 according to control signal WAKE and a read control signal (e.g., control signal RDEN). When a controller unit (not shown) determines that the bit cell is in a sleep state (i.e., inactive), the controller unit provides control signal WAKE having an inactive level (e.g., WAKE='0') to bit cell 140. When control signal WAKE is inactive, footer transistor 304 and footer transistor 308 are inactive and power-saving write-assist circuit 302 is configured to provide a positive nonzero voltage that is less than power supply voltage VDD, but low enough to keep the bit cell within a retention voltage limit to be used as the ground reference (e.g., one semiconductor diode drop above ground). Thus, power-saving write-assist circuit 302 reduces power consumption of bit cell 140 when bit cell 140 is configured in a sleep state.

When the controller unit determines that bit cell 140 has an awake state, the controller unit provides a corresponding control signal that configures power-saving write-assist circuit 302 in an awake state. For example, control signal WAKE is active (e.g., WAKE='1') and enables footer transistor 304 to couple virtual power supply node VVSS to power supply node VSS (e.g., ground) and footer transistor 308 is selectively enabled based on control signal WAKE and the type of access to bit cell 140.

When bit cell 140 is in an active state and footer transistor 304 is enabled, if a memory access is a read (e.g., RDEN='1'), then footer transistor 308 is also enabled and footer transistor 304 and footer transistor 308 couple virtual power supply node VVSS to ground with a first strength. Footer transistor 304 and footer transistor 308 have sizes that firmly pull virtual power supply node VVSS to ground and keep virtual power supply node VVSS at ground for the duration of the read. When the memory access is a write (e.g., RDEN='0'), then footer transistor 308 is disabled and footer transistor 304 couples virtual power supply node VVSS to ground with a second strength. Footer transistor 304 has a size that causes footer transistor 304 to pull virtual power supply node VVSS to ground, but as a bit line discharges to virtual power supply node VVSS, virtual power supply node VVSS floats up towards VDD, thereby weakening a pull-up transistor (e.g., pull-up transistor 105 and pull-up transistor 107 in FIG. 1) of bit cell 140 since the pull-up transistor is biased with a gate-to-source voltage of VVSS-VDD. The weakening of the pull-up transistor increases writability of bit cell 140.

Referring to FIG. 3, in at least one embodiment of power-saving write-assist circuit 302, footer transistor 304 has size Y and footer transistor 308 has size X-Y. In at least one embodiment, X and Y are positive numbers. In at least one embodiment, X is greater than Y. In at least one embodiment, footer transistor 304 and footer transistor 308 are fin field-effect transistors (FinFETs), X and Y are positive integers, and X is greater than Y. Each FinFET includes either multiple fins per finger or multiple fingers in parallel. In at least one embodiment, footer transistor 304 includes one finger with Y fins per finger and footer transistor 308 includes one finger with X- Y fins per finger. However, in other embodiments, footer transistor 304 and footer transistor 308 are implemented using other transistor types, other sizes or ratios of sizes. Table 1 summarizes the selective configuration of virtual power supply node VVSS in an exemplary power-saving write-assist circuit.

TABLE 1

Selective Configuration of Virtual Power Supply Node VVSS

| WAKE | RDEN | WSS |
|---|---|---|
| 0 | 0 | floats to VSS + VT |
| 0 | 1 | floats to VSS + VT |
| 1 | 0 | VSS using a first strength and floats up slightly as bit lines discharge (write-assist on selected column and dynamic power savings on half-selected columns) |
| 1 | 1 | VSS using a second strength and stays at VSS for duration of READ, the second strength being greater than the first strength |

Figure 4:
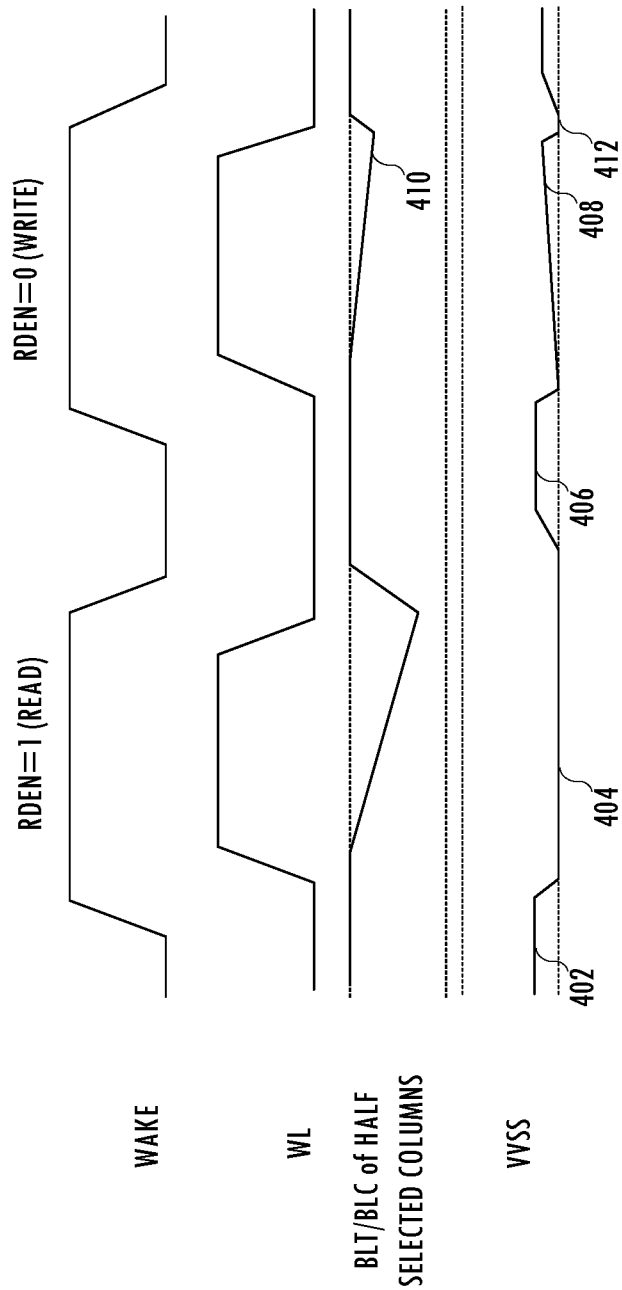
FIG. 4 illustrates exemplary waveforms for operation of the circuit of FIG. 3 consistent with at least one embodiment of the invention.

Referring to FIGS. 3 and 4, in at least one embodiment of power-saving write-assist circuit 302, when control signal WAKE is inactive, indicating a sleep mode of bit cell 140, virtual power supply node VVSS floats to a predetermined level, level 402, e.g., one semiconductor diode drop (VT) above VSS. When control signal WAKE is active, indicating an active mode of bit cell 140, and control signal RDEN is active (e.g., RDEN='1'), power-saving write-assist circuit 302 has a first strength that firmly pulls virtual power supply node VVSS to level 404, e.g., VSS, and stays at that level for the duration of the read (e.g., using a path between virtual power supply node VVSS and power supply node VSS that has low or negligible resistance). When control signal WAKE returns to an inactive level, virtual power supply node VVSS floats back to the predetermined level, e.g., level 406 is one semiconductor diode drop (VT) above VSS.

When control signal WAKE is active, indicating an active mode of the bit cell, and control signal RDEN is inactive (e.g., RDEN='0'), indicating a write, power-saving write-assist circuit 302 has a second strength, which is weaker than the first strength, pulls virtual power supply node VVSS to VSS. As bit lines in bit cell 140 discharge, VVSS reaches level 408 as virtual power supply node VVSS floats up towards VDD (e.g., via a path between virtual power supply node VVSS and power supply node VSS with increased resistance as compared to the path when control signal RDEN is active) and weakens the pull-up transistors in bit cell 140, thereby assisting the write of bit cell 140. Since level 408 is not all the way at VSS, a pass gate transistor of bit cell 140 will be weaker than during a read, and bit lines BLT and BLC will not develop as much differential, thus reducing power consumption during a subsequent precharge of bit lines. Any degradation of stability of bit cell 140 is mitigated by an increase in stability as the bit line discharges. Since virtual power supply node VVSS cannot float higher unless charge is pulled from the bit lines to virtual power supply node VVSS, bit line BLT/BLC discharges, as illustrated by level 410, to charge virtual power supply node VVSS to a level above VSS. When word line WL turns off before control signal WAKE becomes inactive, virtual power supply node VVSS returns to VSS at level 412 and gradually floats back up to the predetermined level (e.g., one semiconductor diode drop above VSS) after control signal WAKE returns to an inactive level.

Figure 5:
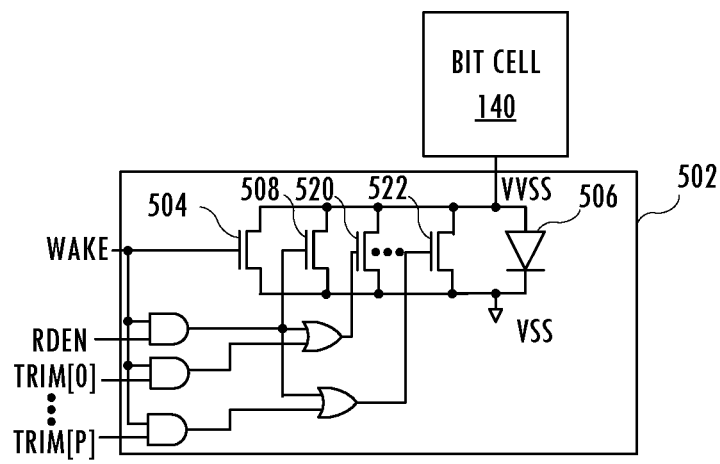
FIG. 5 illustrates an exemplary bit cell coupled to a power-saving write-assist circuit implementing trim control consistent with at least one embodiment of the invention.

In at least one embodiment, a power-saving write-assist circuit implements trim transistors that adjust the strength of the power-saving write-assist circuit for a read or a write. Referring to FIG. 5, an exemplary power-saving write-assist circuit 502 includes trim transistors 520 and 522, which are selectively enabled by logic within power-saving write-assist circuit 502 to implement a target strength of the power-saving write-assist circuit 502 for a write access adjusted according to a control signal (e.g., control signal TRIM[0] ... [P]) to compensate for variations in manufacturing process. Trim transistors are selectively enabled to fine tune the actual strength of power-saving write-assist circuit 502 to achieve a target strength during a write. For example, if manufacturing produces an undersized footer transistor 504 and the undersized footer transistor impacts write performance (e.g., virtual power supply node VVSS floats too high and causes stability problems), then at least one control signal TRIM[0] . . . [P] is enabled to increase the actual strength of the power-saving write assist circuit during a write access to the target strength. In at least one embodiment, all trim transistors are active during a read and control signal TRIM[0] . . . [P] is predetermined during production test or a diagnostic mode of an integrated circuit including the bit cell 140 to achieve a target strength during a write. In other embodiments, other configurations of trim transistors are used, e.g., at least one trim transistor is selectively enabled according to control signal TRIM[p] and in response to an active level of control signal WAKE for achieving target strengths during reads and writes.

Figure 6:
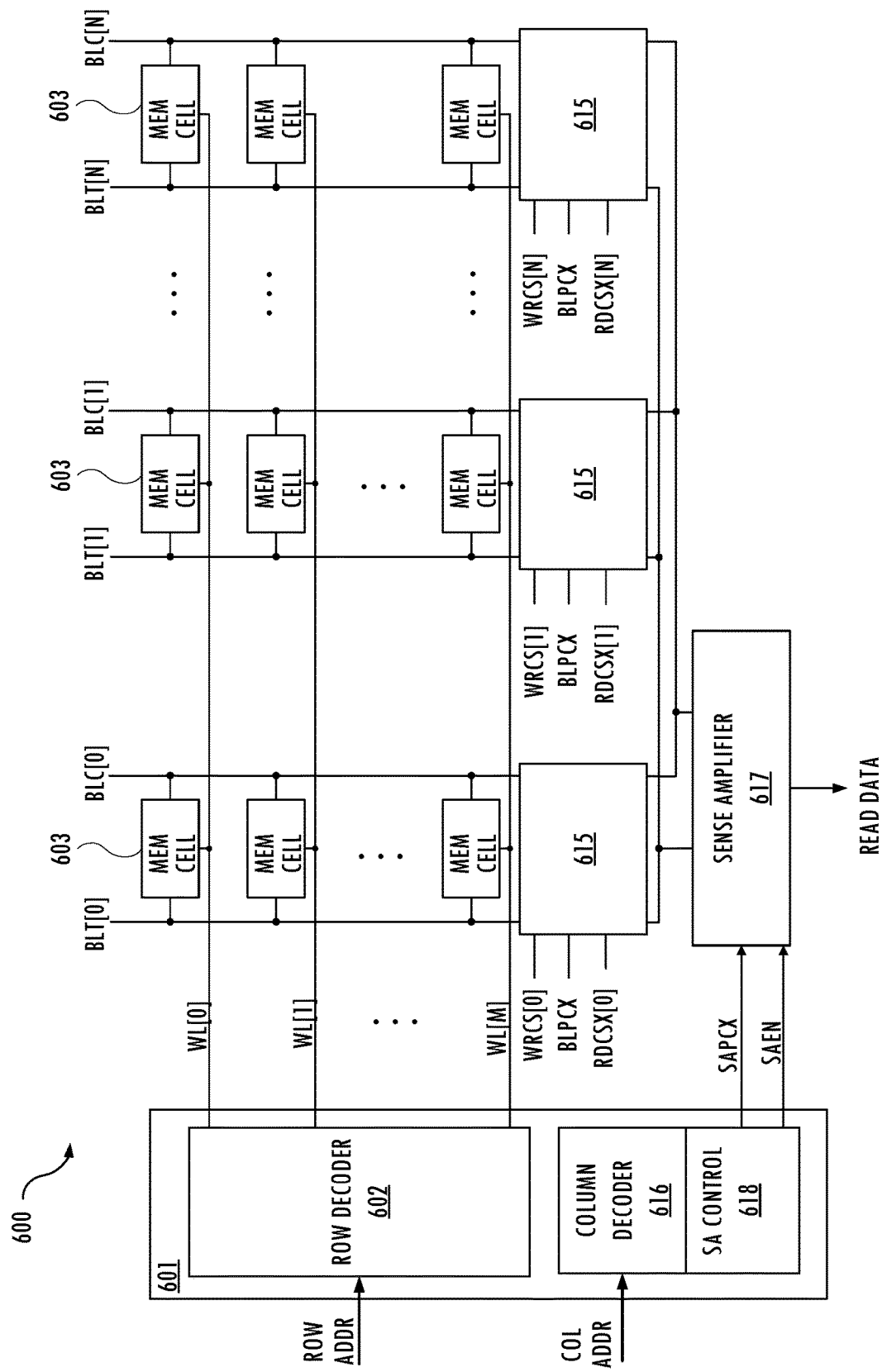
FIG. 6 illustrates a functional block diagram of a memory array consistent with at least one embodiment of the invention.

FIG. 6 illustrates a high level block diagram of a portion of memory bank 600 that places the memory cell, controller and address decoder, and associated circuitry in context. Controller and address decoder 601 includes row decoder 602 coupled to decode a row address and includes word line drivers that drive word lines WL[0] through WL[M] based on the row address. The word lines are coupled to memory cells 603. Write data is driven to memory cells 603 via complementary bit lines (BLT[0], BLC[0], BLT[], BLC[1], and BLT[N], BLC[N]) according to write column select signals WRCS[]. Complementary bit lines (BLT[0], BLC[0], BLT[1], BLC[1], and BLT[N], BLC[N]) are also coupled to memory cells 603, circuitry 615, and to sense amplifier 617 through read column select transistors (not shown) controlled by RDCSX[N:0]. Column decoder 616 receives the column address and selects the appropriate bit line pair to be coupled to sense amplifier 617 using the RDCSX[N:0] signals. In an embodiment, sense amplifier 617, which is controlled by SA control 618, is the embodiment shown as sense amplifier circuit 120 or another embodiment. Note that the precharge circuitry, keepers, write driver, associated column select circuitry, and write column select signals, which are also controlled by controller and address decoder 601 during write operations, are included in associated circuitry 615 for ease of illustration.

Thus, a technique for reducing power consumption and providing write assist to a memory cell is disclosed. The description of the invention set forth herein is illustrative and is not intended to limit the scope of the invention as set forth in the following claims. For example, while the invention has been described in an embodiment in which a six-transistor bit cell is used in a column-muxed memory design, one of skill in the art will appreciate that the teachings herein can be utilized with memory cells including other numbers of transistors and other memory cell organization. The terms "first," "second," "third," and so forth, as used in the claims, unless otherwise clear by context, is to distinguish between different items in the claims and does not otherwise indicate or imply any order in time, location, or quality. For example, "a first access," and "a second access," does not indicate or imply that the first access occurs in time before the second access. Variations and modifications of the embodiments disclosed herein may be made based on the description set forth herein, without departing from the scope of the invention as set forth in the following claims.

What is claimed is:

1. A method for controlling a bit cell of a memory, the method comprising:
   providing a reference voltage to a virtual power supply node coupled to the bit cell, the reference voltage being provided based on an operational state of the bit cell and a type of memory access to the bit cell,
   wherein the reference voltage floats from a first voltage level on a first power supply node to a second voltage level in response to the operational state being an active state and the type of memory access being a write, the second voltage level being between the first voltage level and a third voltage level on a second power supply node,
   wherein in response to the operational state being a sleep state, the providing comprises disabling a first transistor coupled between the virtual power supply node and the first power supply node and disabling a second transistor coupled between the virtual power supply node and the first power supply node, and
   wherein in response to the operational state being an active state, the providing comprises:
      enabling the first transistor;
      enabling the second transistor in response to the type of memory access being a read; and
      disabling the second transistor in response to the type of memory access being a write.

2. The method as recited in claim 1, wherein the providing comprises adjusting a strength of a circuit coupled to the virtual power supply node, the strength being adjusted to a first strength in response to the operational state of the bit cell being the active state and the type of memory access being a read, and the strength being adjusted to a second strength further based on a predetermined trim control signal in response to the operational state of the bit cell being the active state and the type of memory access being a write, the first strength being stronger than the second strength.

3. The method as recited in claim 2, wherein the predetermined trim control signal is configured to selectively enable trim control transistors to adjust the strength of the bit cell.

4. The method as recited in claim 1, wherein the operational state is the active state or a sleep state and the type of memory access is a read or a write.

5. The method as recited in claim 1,
   wherein in response to the operational state being a sleep state, the reference voltage is a predetermined voltage level between the first voltage level on the first power supply node and the third voltage level on the second power supply node, and
   wherein in response to the operational state being an active state, the providing comprises:
      providing a low resistance path between the first power supply node and the virtual power supply node in response to the type of memory access being a read; and
      providing a higher resistance path between the first power supply node and the virtual power supply node in response to the type of memory access being a write.

6. The method as recited in claim 5, wherein the second voltage level is above ground and the first voltage level is ground.

7. The method as recited in claim 1, wherein the second voltage level is slightly different from the first voltage level.

8. The method as recited in claim 1, wherein a magnitude of a difference between the second voltage level and the first voltage level equals a voltage drop across a semiconductor diode of the bit cell.

9. A memory comprising:
   a bit cell coupled between a first power supply node and a virtual power supply node; and a circuit coupled between the virtual power supply node and a second power supply node,
  wherein the circuit provides a reference voltage to the virtual power supply node, the reference voltage being provided based on an operational state of the bit cell and a type of memory access to the bit cell, and
wherein the circuit causes the reference voltage to float from a first voltage level on the second power supply node to a second voltage level in response to the operational state being an active state and the type of memory access being a write, and the second voltage level being between the first voltage level on the second power supply node and a third voltage level on the first power supply node, and
wherein the circuit comprises:
  a first transistor coupled between the virtual power supply node and the second power supply node and responsive to a state control signal;
  a second transistor coupled between the virtual power supply node and the second power supply node and responsive to the state control signal and an indication of the type of memory access to the bit cell; and
  a diode coupled between the virtual power supply node and the second power supply node,
wherein in response to the operational state being a sleep state, the providing comprises disabling the first transistor and disabling the second transistor, and
wherein in response to the operational state being an active state, the providing comprises:
  enabling the first transistor;
  enabling the second transistor in response to the type of memory access being a read; and
  disabling the second transistor in response to the type of memory access being a write.

10. The memory as recited in claim 9, wherein the operational state is the active state or a sleep state and the type of memory access is a read or a write.

11. The memory as recited in claim 10,
wherein in response to the operational state being a sleep state, the circuit causes the reference voltage to be a fourth voltage level, the fourth voltage level being between the first voltage level and the third voltage level on the first power supply node, and
wherein in the active state, the circuit provides the first voltage level as the reference voltage in response to the type of memory access being a read.

12. The memory as recited in claim 11, wherein the second voltage level is a predetermined voltage above ground and the first voltage level is ground.

13. The memory as recited in claim 10,
wherein in the sleep state, the circuit provides a predetermined voltage level as the reference voltage, the predetermined voltage level being between the first voltage level and the third voltage level on the first power supply node, and
wherein in the active state:
  the circuit provides the first voltage level as the reference voltage via a low resistance path between the second power supply node and the virtual power supply node, in response to the type of memory access being a read, and
  the circuit provides a higher resistance path between the second power supply node and the virtual power supply node in response to the type of memory access being a write.

14. The memory as recited in claim 9, further comprising:
  a control circuit configured to provide to the circuit, a select signal, the state control signal, and an indicator of the type of memory access to the bit cell.

15. The memory as recited in claim 9, wherein the circuit further comprises:
  a logic circuit configured to generate a control signal based on the state control signal and the indication of the type of memory access to the bit cell.

16. The memory as recited in claim 9, wherein the first transistor and the second transistor are fin field-effect transistors (FinFETs) and the first transistor has Y fins and the second transistor has X-Y fins, where X and Y are positive integers.

17. The memory as recited in claim 9, wherein the circuit comprises:
  an additional transistor coupled between the virtual power supply node and the second power supply node and responsive to the state control signal, the indication of the type of memory access to the bit cell, and a predetermined trim control signal.

18. The memory as recited in claim 9, wherein the circuit couples the virtual power supply node to ground with a first strength in response to the type of memory access being a read and couples the virtual power supply node to ground with a second strength in response to the type of memory access being a write, the first strength being greater than the second strength.

19. A method for controlling a bit cell of a memory comprising:
  providing a reference voltage to a virtual power supply node coupled to the bit cell,
  wherein, in a first operational state of the bit cell, the reference voltage has a predetermined level between a first voltage on a first power supply node coupled to the bit cell and a second voltage on a second power supply node,
  wherein, in a second operational state of the bit cell, the reference voltage is the second voltage provided with a first strength in response to a read, and the reference voltage is the second voltage provided with a second strength in response to a write, the first strength being greater than the second strength,
  wherein in response to the first operational state, the providing comprises disabling a first transistor coupled between the virtual power supply node and the first power supply node and disabling a second transistor coupled between the virtual power supply node and the first power supply node, and
  wherein in response to the second operational state, the providing comprises:
    enabling the first transistor;
    enabling the second transistor in response to a read; and
    disabling the second transistor in response to a write.

20. The method as recited in claim 19, wherein the virtual power supply node floats from the second voltage to the reference voltage during the write in the second operational state of the bit cell.

* * * * *